April 21, 1970 D. W. SKINNER ET AL 3,507,430

CERAMIC SUBSTRATE SNAPPING TOOL

Filed Aug. 15, 1967

INVENTORS
DEAN W. SKINNER
STANLEY J. SKOCZ, JR.

BY Joseph L. Spiegel
ATTORNEY 3,507,430

CERAMIC SUBSTRATE SNAPPING TOOL

Dean W. Skinner, Binghamton, and Stanley J. Skocz, Jr., Endicott, N.Y., assignors to International Business Machines Corporation, Armonk, N.Y., a corporation of New York Filed Aug. 15, 1967, Ser. No. 660,691
Int. Cl. B26f 3/00
U.S. Cl. 225—103 6 Claims

ABSTRACT OF THE DISCLOSURE

A ceramic substrate with aligned, W-shaped grooves in opposite surfaces is snapped into separate components by removal of the central portion of the W. The snapping tool includes upper and lower pairs of indentors rigid in the direction of loading and free to move in a direction perpendicular thereto. The indentors seat themselves in the notches of the W-shaped grooves out of contact with the bottom or root of the notch. When a load is applied, tensile stresses developed in the roots of all notches break the substrate into separate components and remove the central portion of the W.

BACKGROUND OF THE INVENTION

Field of the invention

This invention relates to circuit components and to the manufacture thereof; and, in particular to the manufacture of a plurality of circuit components using a single ceramic substrate which is thereafter subdivided to form a plurality of individual circuit components.

In the fabrication of microminiature modules and the like, it is common practice to deposit, as by silk screening techniques, a conductive paste on the surface of an insulating substrate in a desired network and subsequently fire to form a conductive pattern thereon. Then, thin or thick film resistors, capacitors or inductors are deposited, as by evaporation in the case of thin film elements or silkscreening in the case of thick film elements, on the surface of the substrate at appropriate positions in the circuit pattern and then fired to solidify same. Active devices may also be attached to the conductive pattern, as, for example, in the manner described in a copending application of Davis et al. entitled "Functional Components," U.S. Ser. No. 300,734, filed Aug. 8, 1963 and assigned to the same assignee as the present invention. The fabrication process also includes pinning and tinning operations, during which contact pins are inserted into cavities or through openings in the substrate, and the substrate is immersed in a molten metal, typically solder. The solder will wet the pattern and contact pins so as to provide good electrical conductivity and continuity and also aid in the attachment of chip devices to the conductive pattern. The contact pins will be connected to external circuitry, as by insertion in a printed circuit board. The processing is then normally completed by some form of packaging, as encapsulation.

In the foregoing process, the advantages of using ceramic as the insulating substrate, namely chemical and electrical inertness, rigidity, stability, reliabilty and adaptability to automated fabrication processes have been amply demonstrated. The thermal coefficient of expansion of the ceramic closely matches that of the devices which it carries. Also, the ceramic provides excellent thermal paths for cooling and adapts readily to environmental protection techniques.

DESCRIPTON OF PRIOR ART

To further production efficiency, it has been sugggested to form a plurailty of circuit elements using a single ceramic substrate, and then subdivide the substrate to form a plurality of individual circuit components. Various methods of subdividing have been tried. One approach has been to form the circuit elements and then subdivide by sawing or scribing. Another approach has been to score or groove the substrates, either before or after circuit elements have been formed, and then subdivide by breaking.

In pursuing the latter approach, the following problems have been noted. The grooves are normally closely spaced to circuit elements formed on the surfaces of the substrate. When the substrate is broken into discrete components, stresses are transmitted to the elements, resulting in unpredictable changes in their characteristics. Thus, resistive films deposited on the surface of a substrate adjacent to a groove may have one value before breakage and another afterwards.

Another problem is the unpredictability or unevenness of the break. In this situation, after breakage the edges of both components are jagged, with one or both edges having some regions which jut out and others which are nicked. The finished components in use are frequently assembled in closely spaced relationship as by insertion of their contact pins in the terminal holes of a printed circuit board. This places a maximum length limitation on the size of components. Thus, those components which have edges with regions that jut out may not be usable until the edges have been smoothed off or precision trimmed.

In the extreme, the random shattering of the ceramic material may result in chipping away of whole portions of the substrate, including those portions of the substrate bearing an impedance element, an active device or the conductive pattern, thus resulting in destruction of the component.

Accordingly, an object of the invention is the improved manufacture of a plurality of circuit components using a single ceramic substrate.

Another object is breaking a substrate having a plurality of circuit elements formed thereon into a plurality of separate circuit components, without damage to the elements or alteration of their characteristics.

Still another object is attaining smooth, clean breaks in subdividing a substrate into a plurality of separate circuit components.

SUMMARY OF THE INVENTION

There is first provided a ceramic substrate with aligned grooves in opposite surfaces of the substrate. The groove is formed by a pair of closely spaced notches with a narrow ridge therebetween, giving the groove in cross section a W-shaped configuration. Circuit elements are supported on the surfaces of the substrate with grooves being interposed between adjacent elements. The circuit elements are separated from one another so as to form a plurality of discrete components by the removal of the material forming the ridge or central portion of W. The configuration of the groove is such that the substrate has sufficient strength to be further processed, tested, shipped and used in an unbroken state. On the other hand, if at any time between the time the substrate is first manufactured until it is ultimately put into use, it is advantageous that the substrate be broken into separate components, the configuration of the groove is such as to allow a clean break and so as to localize stresses whereby the stresses are prevented from being transmitted to the surface of the substrate which can lead to changing of circuit values, and in the extreme, fracture of the circuit element bearing surfaces and thus destruction of the component. The substrate and related matter are claimed in a copending application of Bross et al., entitled "Ceramic Substrates for Circuit Components and Method of Manufacture," filed Aug. 15, 1967, Ser. No. 660,689 and assigned to the same assignee as the present invention.

In accordance with the teachings of the present invention, there is provided a tool for breaking the substrates and for removing the central portion that includes an upper pair of floating wire indentors and a lower pair of floating wire indentors and upper and lower dies for applying a load to the upper and lower indentors, respectively. The indentors are rigid in the direction of loading but free to move or float in a direction perpendicular thereto. This floating principle allows the indentors to seat themselves in the notch areas of the W-shaped grooves.

The indentors seat themselves in the notches in contact with its sidewalls, but do not rest on the bottom or root of the notch. When a load is applied, tensile stresses are developed in the roots of all notches. For ceramic material this is advantageous because ceramics are weaker in tension than compression. Also, tensile breaks are clean and well defined. When a load of sufficient magnitude is applied to the indentors, the substrate breaks into two separate components and the region generally defined by the ridges or central portions of the aligned, W-shaped grooves is removed. No stresses are transmitted to the circuit elements which would result in damage to them or alteration of their characteristics.

BRIEF DESCRIPTION OF THE DRAWING

The foregoing and other objects, features and advantages of the invention will be apparent from the following more particular description of the preferred embodiments of the invention as illustrated in the accompanying drawing, wherein.

DESCRIPTION OF THE PREFERRED EMBODIMENTS

Figures 1, 2, 3, 4, 5:
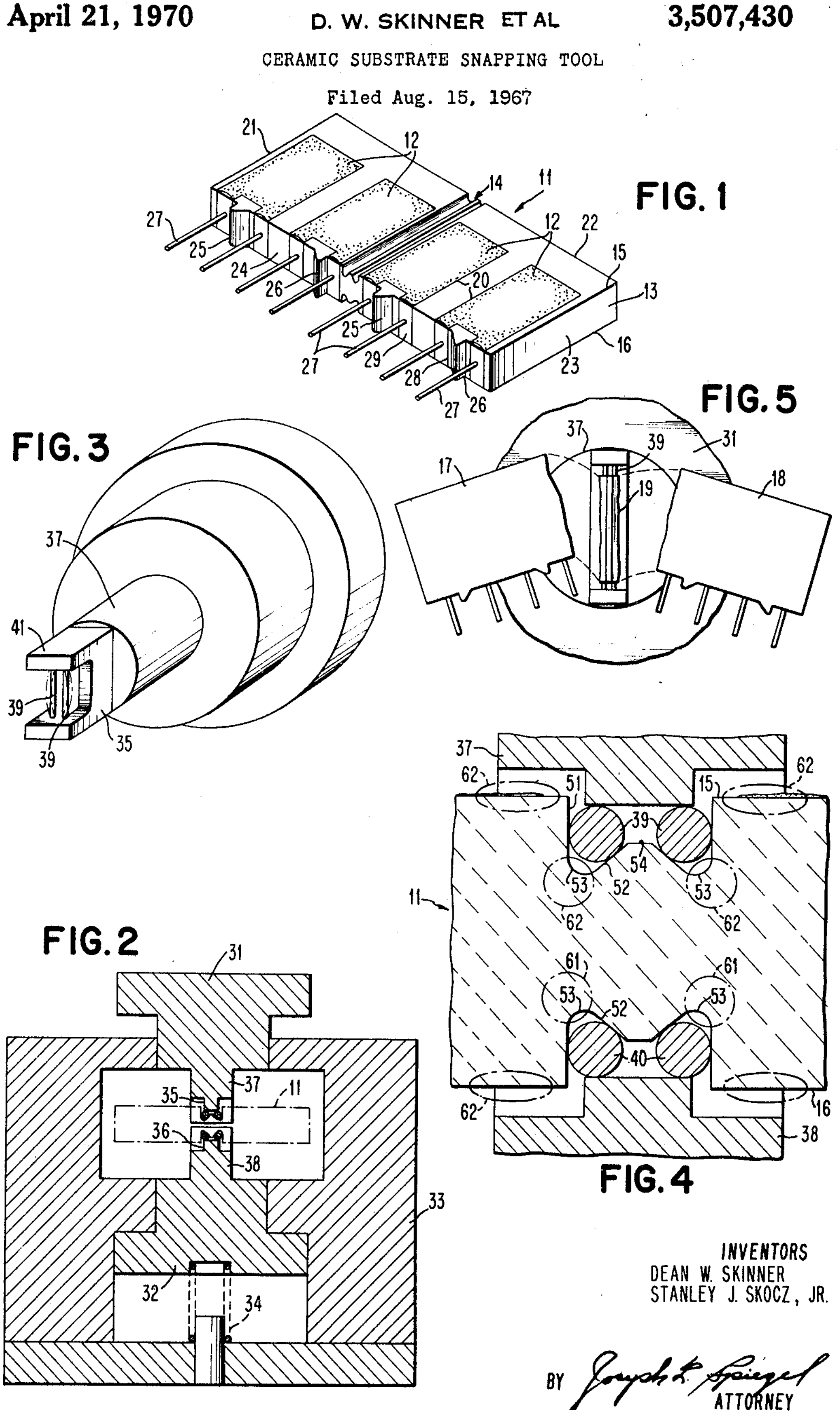
FIGURE 1 is a perspective view of a modular component which may be subdivided into a plurality of separate components.
FIGURE 2 is a cross-sectional view of a tool for breaking the modular component of FIGURE 1 into separate components.
FIGURE 3 is a perspective view of the upper piston, die and indentors of the breaking tool of FIGURE 2.
FIGURE 4 is an enlarged fragmentary cross-sectional view of the indentors of the breaking tool of FIGURE 2 and of the grooved region of the modular component of FIGURE 1.
FIGURE 5 is an enlarged, fragmentary bottom view of the upper piston, die and indentors of the breaking tool of FIGURE 2 and of the modular component after the selvage region has been removed.

Referring now to FIGURE 1 of the drawing there is disclosed a modular component 11 comprising a plurality of circuit elements 12 supported on a ceramic substrate 13. Some of the elements 12 are readily separated from other elements by the removal of material within a pair of aligned grooves 14 formed in opposite surfaces 15, 16 of the substrate 13 to form, as shown in FIGURE 5, separate discrete components 17, 18 and a central selvage region 19.

The substrate 13 is preferably high alumina content material, although others may be used, for example, zircon, aluminum silicates, zirconium dioxide, titanium dioxide, magnesium silicates, barium titanate, and various combinations thereof. The type material used will depend on, among other things, process considerations and the type of elements to be formed. The substrate may be formed by dry process techniques, in which the ceramic raw materials in dry powdered form, are metered out to a cavity in a mold, leveled, pressed, ejected from the press and fired. Alternatively, it could be formed by wet processing, in which the powdered ceramic materials are dispersed in a binder to form a slip which is then cast or extruded into a thin sheet. The green sheet is then cut or punched to size, grooved, and contact cavities or holes are formed. Then the sheet is fired.

The substrate 13 includes the two major wall surfaces 15, 16 on one or both of which impedance films may be formed. In the drawing films 20 appear only on the surface 15. The substrate further includes smooth end 21, top 22 and end 23 walls. The bottom surface 24 is provided with standoffs 25, 26 for providing spacing between the major portion of the substrate and a board or panel in which the to be formed component will be inserted. In a typical embodiment, the dimensions of the substrate 13, after firing, are in length 0.976″, in height 0.342″, and in thickness 0.102″.

The substrate is provided with a plurality of cavities (now shown) in which lead wires or contact pins 27 are anchored. The cavities open to a recess 28 in the bottom surface 24 which extends between the wall surfaces 15 and 16.

Conductive paste material is deposited onto the walls of the cavities and onto the walls of the recess 24. The conductive material is to form electrically conductive links 29, between the contact pins 27 and films 20. The paste material is fired to bond the material to the substrate and render it conductive. Where the impedance films are to be spaced from the recesses 28, a conductive pattern is formed, as by silk screen printing, on the surface 15, linking the metallization within the recess 28 with the impedance films 20.

The impedance films 20 such as resistors, capacitors and inductors are formed on the surface 15 of the substrate, as by evaporation in the case of thin film elements, or conventional silk screen and firing techniques in the case of thick film elements. In the illustration the elements 20 are in overlapping relationship with the edges of recess 28 so as to form an electrically continuous path.

Reference will now be had to FIGURE 4 disclosing the details of the groove 14. The groove 14 includes smooth sidewalls 51 generally perpendicular to the surface 15, 16 and inner walls 52 slanted with respect to the perpendicular sidewalls 51, typically at 50°. The walls 51, 52 together form a notch, the bottom or root of which, indicated by the reference numerals 53, is typically rounded with a maximum radius of curvature of 0.005″. In FIGURE 4 straight, parallel lines drawn from the upper roots to the lower roots define generally the selvage region 19 in FIGURE 5 which is to be removed during the breaking operation. The inner walls 52 come together to form a ridge 54 which may be curved, or flattened out as shown in the drawing. In a typical embodiment the grooves are 0.048″ wide, and 0.026″ from the substrate surface to the root 53., As mentioned above, major objects of the present invention are the breaking of a substrate having a plurality of circuit elements formed thereon into a plurality of separate circuit components without damage to the elements or alteration of their characteristics and in the process, attaining smooth, clean breaks.

In accordance with the teachings of the present invention, and referring now to FIGURES 2–4 there is disclosed a breaking tool for accomplishing these objects. The tool includes an upper 31 and lower 32 piston slidably mounted within guide holes of a body member 33. The lower piston is preloaded by a spring at 34. Die members 35, 36 are formed on projections 37, 38 extending from pistons 31, 32 respectively. Pairs of indentors 39, 40, typically steel piano wire of 0.020″ diameter, are anchored or slidably held within slots in extensions of the respective die members. In FIGURE 3 the extensions of die 35 are denoted by the reference numeral 41. The extensions also prevent the indentors from banging into each other after breaking a substrate. The indentors rest on the die members and therefore are rigid in the direction of load but are free to flex or float in a direction perpendicular thereto, as indicated by the dashed lines in FIGURE 3.

Operation of the tool and breaking of the substrate will now be described. A substrate is placed within body member 33 with the indentors 40 coming to rest in the groove 14 in surface 16. Piston 31 is then lowered such that the indentors 39 come to rest in the groove 14 in surface 15.

Upon further relative movement between pistons 31 and 32 and owing to the fact that the indentors 39 and 40 are free to flex or float in a direction perpendicular to the direction of loading, the indentors will seat themselves in the notches coming into contact with the walls 51 and 52. By coming in contact with the sidewalls 51 and 52, the indentors produce a lever arm effect which in turn produces tensile stresses at the roots 53.

The load is increased until as shown in FIGURE 5, the discrete components 17, 18 separate almost simultaneously from the central selvage region 19. The breaks are clean. There is no damage to the impedance element bearing surface of the components and impedance values are unaffected by the snapping action.

Photoelastic investigations were conducted and revealed the following. The stresses developed in the regions about the roots 53 (generally defined by the curved dashed lines 61) of all 4 notches were tensile. For ceramic substrates this is advantageous in that ceramics are weaker in tension than in compression. Also, tensile breaks in ceramics are clean and well defined as opposed to compression breaks which may result in random shattering of the material. Secondly, there are essentially no stresses developed in the impedance element regions generally defined by the elliptical dashed lines 62. As noted above this is preferable in that the stresses developed may cause chipping of the impedance element bearing surface and thus destruction of the component, or the stresses may change the characteristics of the elements 20 such as changing the resistivity of resistor. Thirdly, if one of the discrete components were to separate from the central portion before the other, stress conditions would be such that stresses in areas 61 between the unseparated component and the central portion would be twice the value they were before separation of the first component. Thus, if the load were maintained after separation of the first component, say 17, separation of the second component 18 from the central portion 19 would almost immediately follow. By spring loading the bottom piston 32 the load is maintained after first component separates and for all practical purposes both components separate from the central portion simultaneously.

Furthermore, the photoelastic investigations also reveal that operation of the indentors imposes certain limitations on their design. If the combined width of a pair of indentors exceeds the width of the groove, a wedging action wil occur when the indentors are forced into the groove. This results in high stresses in areas 62 and sometimes causes breakage of the substrate in areas 62.

On the other hand, if the size or shape of the indentors is such as to allow the indentors to contact the roots 53 of the notches, compressive stresses will be developed which cause shattering of the substrate material.

Finally, if the indentors were rigidly connected, the stresses developed in areas 61 would be small compared to the stresses developed in the indentors. In order to snap the substrate large loads would have to be applied which, rather than snapping the substrate, would damage the indentors.

While the invention has been particularly shown and described with reference to the preferred embodiments thereof, it will be understood by those skilled in the art that the foregoing and other and various changes in form and details may be made therein without departing from the spirit and scope of the invention.

What is claimed is:

1. A tool for removing a selvage region of ceramic material formed between aligned pairs of notches within aligned grooves in opposite surfaces of a ceramic substrate comprising:

a first pair of indentors for engaging the sidewalls of the notches in one of said opposite surfaces;

a second pair of indentors for engaging the sidewalls of the notches in the other of said opposite surfaces;

said pairs of indentors being adapted for relative movement toward one another; and said indentors being rigid in said direction of relative movement and flexible in a direction perpendicular thereto, whereby upon said relative movement said indentors enter said grooves, engage and align with the sidewalls of said notches and snap said selvage region from said substrate.

2. The tool according to claim 1 wherein the combined cross-sectional dimension of a pair of said indentors is less than the cross sectional dimension of said groove.

3. The tool according to claim 2 wherein the cross sectional dimension of said indentors is greater than the cross sectional dimension of said notches.

4. A tool for removing a selvage region of material formed between aligned pairs of notches within aligned grooves in opposite surfaces of a ceramic substrate comprising:

a body member;

said body member having a guide hole;

first and second pistons reciprocably mounted within said guide hole for relative movement therebetween;

first and second dies projecting from said first and second pistons, respectively, toward one another; and first and second pairs of indentors mounted on said first and second dies, respectively, for engaging the sidewalls of said notches upon relative movement of said pistons toward one another;

said indentors being rigid in the direction of said relative movement and flexible in a direction perpendicular thereto, whereby upon relative movement of said pistons toward one another, said indentors enter said grooves, engage and align with the sidewalls of said pairs of notches and snap said selvage region from said substrate.

5. The tool according to claim 4 wherein the combined cross-sectional dimension of a pair of said indentors is less than the cross-sectional dimension of said groove.

6. The tool according to claim 5 wherein the cross-sectional dimension of said indentors is greater than the cross-sectional dimension of said notches.

References Cited

UNITED STATES PATENTS

| | | | |
|---|---|---|---|
| 2,607,169 | 8/1952 | Randels | 225—2 |
| 3,195,225 | 7/1965 | Belliveau et al. | 29—413 X |

JAMES M. MEISTER, Primary Examiner